(12) United States Patent
Zhao et al.

(10) Patent No.: US 11,322,721 B2
(45) Date of Patent: May 3, 2022

(54) ENCAPSULATION STRUCTURE OF ORGANIC LIGHT EMITTING DIODE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Lei Zhao, Hubei (CN); Gaozhen Wang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 33 days.

(21) Appl. No.: 16/754,241

(22) PCT Filed: Feb. 25, 2020

(86) PCT No.: PCT/CN2020/076555
§ 371 (c)(1),
(2) Date: Apr. 7, 2020

(87) PCT Pub. No.: WO2021/017462
PCT Pub. Date: Feb. 4, 2021

(65) Prior Publication Data
US 2021/0036260 A1    Feb. 4, 2021

(30) Foreign Application Priority Data
Jul. 30, 2019 (CN) .......................... 201910695168.1

(51) Int. Cl.
*H01L 51/52* (2006.01)
*H01L 27/32* (2006.01)
*H01L 51/56* (2006.01)

(52) U.S. Cl.
CPC .......... *H01L 51/5253* (2013.01); *H01L 51/56* (2013.01)

(58) Field of Classification Search
CPC . H01L 51/5253; H01L 51/56; H01L 51/5256; H01L 51/5237; H01L 51/5246;
(Continued)

(56) References Cited

U.S. PATENT DOCUMENTS

2014/0353594 A1    12/2014  Zeng
2018/0190938 A1    7/2018   Wang et al.
(Continued)

FOREIGN PATENT DOCUMENTS

CN    101653723 A    2/2010
CN    103247667 A    8/2013
(Continued)

*Primary Examiner* — Caridad Everhart

(57) ABSTRACT

An encapsulation structure of an organic light emitting diode (OLED) display panel and a manufacturing method thereof are provided. By changing an edge design of a panel encapsulation structure and adding an encapsulation reduction layer to the encapsulation structure, the encapsulation reduction layer can be restored by subsequent processing after the encapsulation reduction layer is eroded by water and oxygen. This prevents an OLED display device from being oxidized, thereby extending a life of a device.

5 Claims, 4 Drawing Sheets

(58) Field of Classification Search
CPC .. H01L 2251/568; H01L 27/32; H01L 51/568
See application file for complete search history.

(56) References Cited

U.S. PATENT DOCUMENTS

| | | | |
|---|---|---|---|
| 2019/0140206 A1 | 5/2019 | Liu et al. | |
| 2019/0275460 A1* | 9/2019 | Zhong | H01L 33/005 |
| 2020/0091460 A1* | 3/2020 | Yoo | B32B 15/08 |
| 2020/0127230 A1* | 4/2020 | Moon | B32B 27/20 |
| 2021/0226149 A1* | 7/2021 | Luo | H01L 51/56 |

FOREIGN PATENT DOCUMENTS

| | | |
|---|---|---|
| CN | 103730071 A | 4/2014 |
| CN | 104821376 A | 8/2015 |
| CN | 105185806 A | 12/2015 |
| CN | 105355645 A | 2/2016 |
| CN | 105679961 A | 6/2016 |
| CN | 106984824 A | 7/2017 |
| CN | 107199348 A | 9/2017 |
| CN | 107331787 A | 11/2017 |
| CN | 107464888 A | 12/2017 |
| CN | 107887527 A | 4/2018 |
| CN | 110473982 A | 11/2019 |
| JP | 2003157970 A | 5/2003 |

\* cited by examiner

ENCAPSULATION STRUCTURE OF ORGANIC LIGHT EMITTING DIODE DISPLAY PANEL AND MANUFACTURING METHOD THEREOF

CROSS-REFERENCE TO RELATED APPLICATION

This application claims the priority of Chinese Application No. 201910695168.1 filed on Jul. 30, 2019 and titled "ENCAPSULATION STRUCTURE OF ORGANIC LIGHT EMITTING DIODE DISPLAY PANEL AND MANUFACTURING METHOD THEREOF", which is incorporated herein by reference in its entirety.

FIELD OF INVENTION

The present disclosure relates to the field of display technologies, and more particularly to an encapsulation structure of an organic light emitting diode (OLED) display panel and a manufacturing method thereof.

BACKGROUND OF INVENTION

In current flexible panel packaging processes, in order to block erosion of organic light emitting diodes (OLEDs) by water and oxygen, three-layer thin-film packaging technology is generally used for packaging. That is, an encapsulation structure of a barrier film, a buffer film, and a barrier film (SiNx, IJP, and SiNx) is used for packaging. The encapsulation structure shown in FIG. 1 includes a substrate 101, a protective layer 102 covering the substrate 101, an OLED device 103 disposed on the protective layer 102, a retaining wall 104 disposed at an edge region of the OLED device 103, a first barrier film layer 105 covering the OLED device 103 and the retaining wall 104, a buffer film 106 disposed on the first barrier film layer 105, and a second barrier film layer 107 covering the buffer film 106.

Because chemical deposition process during the packaging process will inevitably generate fine dust, it is easy for a barrier film layer to generate a path for water to flow, causing packaging failure. This causes an OLED device to be eroded by water and oxygen, which affects a service life of an OLED display panel.

In view of the above issues, it is necessary to provide an encapsulation structure and a manufacturing method thereof to solve issues that an OLED device is eroded by water and oxygen due to package failure, thereby extending a service life of an OLED display panel.

SUMMARY OF INVENTION

Embodiments of the present application provide an encapsulation structure of an organic light emitting diode (OLED) display panel and a manufacturing method thereof, by changing an edge design of a panel encapsulation structure and adding an encapsulation reduction layer to the encapsulation structure, the encapsulation reduction layer can be restored by subsequent processing after the encapsulation reduction layer is eroded by water and oxygen, which prevents an OLED display device from being oxidized, thereby extending a life of a device.

In a first aspect, an embodiment of the present application provides an encapsulation structure of an organic light emitting diode (OLED) display panel, comprising: a thin film encapsulation layer disposed on a surface of the OLED display panel; the thin film encapsulation layer comprising an encapsulation reduction layer, an encapsulation overlay layer, and a peelable water-oxygen barrier film; the encapsulation reduction layer disposed in the encapsulation overlay layer; the peelable water-oxygen barrier film adhered to an edge of the encapsulation overlay layer to be sealed; wherein after the encapsulation reduction layer is eroded by water and oxygen, the encapsulation reduction layer is dried and reduced by removing the peelable water-oxygen barrier film, such that the OLED display panel is prevented from being eroded by water and oxygen. This enables recyclability and extends a life of the OLED display panel.

In an embodiment of the present application, the encapsulation overlay layer comprises at least one organic film layer and at least one inorganic film layer which are arranged on top of each other, the inorganic film layer is disposed on at least one side of the organic film layer, and the organic film layer is disposed on at least one side of the encapsulation reduction layer. The encapsulation reduction layer is not limited to one layer. A thickness of the encapsulation reduction layer ranges from 0.01 to 0.03 µm. Material of the encapsulation reduction layer comprises one or a combination of two or more active metals comprising magnesium, silver, copper, and iron.

In an embodiment of the present application, a bottom film layer of the encapsulation overlay is an inorganic film layer, the inorganic film layer covers a region where a light emitting material of the OLED display panel is disposed, and the inorganic film layer is greater than or equal to a region defined by the peelable water-oxygen barrier film.

In an embodiment of the present application, the peelable water-oxygen barrier film comprises a peelable film and a barrier film, and the barrier film is disposed outside the peelable film.

In an embodiment of the present application, a top of the peelable film is lower than a plane on which a top film layer of the encapsulation overlay layer is disposed, material of the peelable film comprises a UV reducing film or a polyimide film; a top of the barrier film is flush with a top surface of the top film layer of the encapsulation overlay layer, and material of the barrier film comprises a glue or glass cover with good water and oxygen barrier properties.

In an embodiment of the present application, a thickness of the inorganic film layer is about 1 µm; a material of the inorganic film layer may be silicon nitride, silicon oxide, or aluminum oxide; a thickness of the organic film layer ranges from 4 to 6 µm, the organic film layer can be made by inkjet printing technology, organic vapor deposition, or other thin film preparation processes, material of the organic film layer comprises a material having a good water transmission rate.

In a second aspect, an embodiment of the present application provides a method of manufacturing an encapsulation structure of an OLED display panel, comprising following steps: S1: providing an OLED display panel to be packaged; S2: forming a first inorganic film layer, wherein the first inorganic film layer covers an organic light emitting material region of the OLED display panel; S3: forming a first peelable water-oxygen barrier film on an upper side or an outer side of an end portion of the first inorganic film layer; wherein a thickness of the first peelable water-oxygen barrier film may be about 20 µm; S4: sequentially forming a first organic film layer in a region defined by the first peelable water-oxygen barrier film; S5: forming an encapsulation reduction layer on the first organic film layer; S6: forming a second organic film layer on the encapsulation reduction layer by using inkjet printing technology; S7: forming a second inorganic film layer on the second organic film layer; 38: using UV light irradiation or laser peeling technology to peel the first peelable water-oxygen barrier film, and forming a second water-oxygen barrier film in a first water-oxygen barrier film region, according to forms of water-oxygen barrier films, differences are as follows: S81: the water-oxygen barrier film is an integrated form of the peelable film and the barrier film, and a top of the second water-oxygen barrier film is flush with a top of the second inorganic film layer; S82: If the water-oxygen barrier film is a combination of the peelable film and the barrier film, a top of the peelable film is lower than the top of the second inorganic film layer; the barrier film is formed outside the peelable film, and a top of the barrier film is flush with the top of the second inorganic film layer; 39: determining whether to perform a dry reduction process to the encapsulation reduction layer through a color change of the encapsulation reduction layer; S91: if the encapsulation reduction layer has no color change, the encapsulation reduction layer is not subjected to the dry reduction process; S92: if the encapsulation reduction layer undergoes a color change, the encapsulation reduction layer is subjected to a dry reduction process, comprising following steps: S921: using UV light irradiation or laser peeling technology to peel the second water-oxygen barrier film in the encapsulation structure; S922: passing a one-way flowing reducing gas into the reduction device, and performing the dry reduction process to the encapsulation reduction layer by using a common action of the reducing gas, the molecular sieve water-absorbing film, the first organic film layer, and the second organic film layer, which realizes reduction of the encapsulation reduction layer; and S923: reforming the second water-oxygen barrier film, wherein the second water-oxygen barrier film is disposed at a position where the second water-oxygen barrier film is originally disposed.

In an embodiment of the present application, the first inorganic film layer, the first organic film layer, the encapsulation reduction layer, the second inorganic film layer, and the second organic film layer are not limited to being symmetrically arranged, and different levels of sequences can be selected according to different needs, a number of each film layer can also be increased or decreased accordingly as required, and a thickness of each film layer can be set to different thicknesses according to different needs.

In a third aspect, an embodiment of the present application provides a reduction device of a panel encapsulation structure, at least comprising: a molecular sieve water-absorbing film and a reducing gas; wherein the reduction device realizes reduction of an encapsulation reduction layer through mutual cooperation of the reducing gas and the molecular sieve water-absorbing film.

In an embodiment of the present application, the molecular sieve water-absorbing film is disposed at least inside one end of the reduction device, and the molecular sieve water-absorbing film needs to be activated and regenerated by changing the temperature or changing a relative pressure after being saturated; the reducing gas is a one-way flowing mixed gas, a temperature of the reducing gas ranges from 80° C. to 100° C., the reducing gas is a 5% to 10% N2/H2 mixed gas, a 5% to 10% Ar/H2 mixed gas, or a reducing gas with good reducing properties.

Beneficial Effect:

Compared with a current encapsulation structure of an OLED display panel, an encapsulation structure of an OLED display panel of an embodiment of the present application changes an edge design and adds an encapsulation reduction layer in the encapsulation structure. Whether a device is oxidized is determined by color change of an encapsulation reduction layer. Good water vapor transmission characteristics of an organic film layer and an encapsulation reduction device are used to realize reduction of the encapsulation reduction layer. This solves issues that the OLED display device is eroded by water and oxygen due to package failure, and can prolong a service life of the OLED display panel.

DETAILED DESCRIPTION OF PREFERRED EMBODIMENTS

The present application provides n encapsulation structure of an organic light emitting diode (OLED) display panel and a manufacturing method thereof. In order to make the purpose, technical scheme and effect of the present application clearer and clearer. Hereinafter, the present application will be described in detail with reference to the accompanying drawings and examples. It should be understood that the specific embodiments described herein are only used to explain the present application, and are not used to limit the present application.

Figure 1:
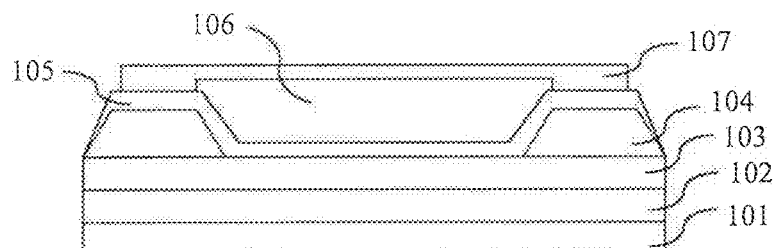
FIG. 1 is a schematic diagram of a conventional encapsulation structure of an OLED panel.
Figure 2:
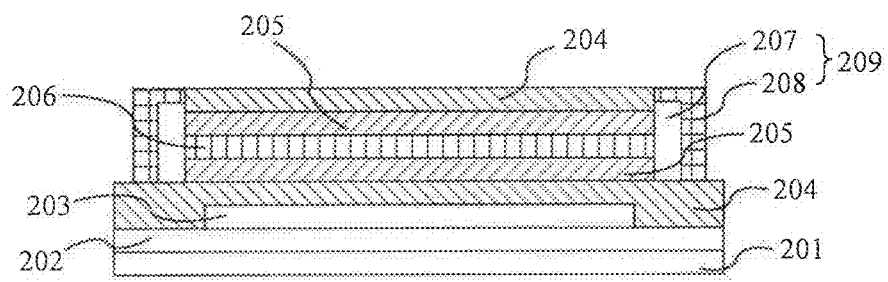
FIG. 2 is a schematic diagram of a first encapsulation structure of an OLED panel according to an embodiment of the present application.

Referring to FIG. 2, which is a schematic diagram of a first encapsulation structure of an OLED panel according to an embodiment of the present application, comprising: a thin film encapsulation layer disposed on a surface of an OLED display panel.

The OLED display panel includes a substrate 201, a protective layer 202, and a light emitting layer 203 disposed on the substrate.

The thin film encapsulation layer comprises an encapsulation reduction layer 206, an encapsulation overlay layer, and a peelable water-oxygen barrier film 209. The encapsulation overlay layer comprises at least one organic film layer 205 and at least one inorganic film layer 204 which are arranged on top of each other. The peelable water-oxygen barrier film 209 comprises a peelable film 207 and a barrier film 208.

The protective layer 202 is covered on the substrate 201. The light emitting layer 203 covers a part of a surface of the protective layer 202. Both the organic film layer 205 and the inorganic film layer 204 are centered on the encapsulation reduction layer 206 and are symmetrically arranged up and down. The inorganic film layer 204 is located outside the organic film layer 205. The inorganic film layer 204 on a side of the substrate 201 covers an organic light emitting material region of the light emitting layer 203. The peelable film 207 is located on an upper side of an end of the inorganic film layer on the substrate, and on an outside of an end of the inorganic film layer on the substrate. A top of the peelable film 207 is lower than a top of the inorganic film layer facing away from the substrate. The barrier film 208 is located outside the peelable film 207. A top of the barrier film 208 is flush with a top of the inorganic film layer 204 remote from the substrate.

Figure 3A:
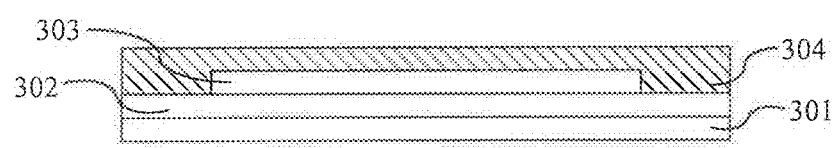
FIG. 3A to FIG. 3F are schematic diagrams of a method of manufacturing an encapsulation structure of a panel according to an embodiment of the present application.

Referring to FIG. 3A to FIG. 3F, an embodiment of the present application also provides a method of manufacturing an encapsulation structure of an OLED display panel, comprising following steps:

S1: referring to FIG. 3A, an OLED display panel to be packaged is provided. The OLED display panel includes a substrate 301, and a protective layer 302 and a light emitting layer 303 prepared on the substrate 301. A first inorganic film layer 304 is prepared on the OLED display panel. The first inorganic film layer 304 covers an organic light emitting material region of the light emitting layer 303.

Figure 3B:
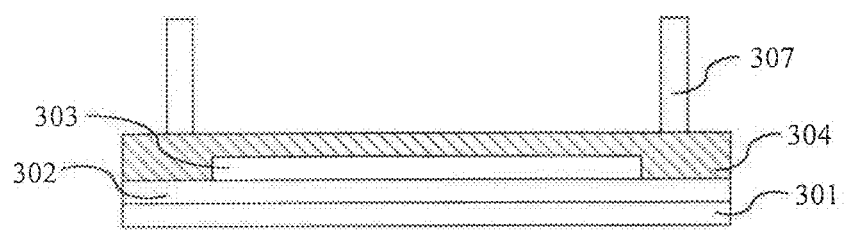
Figure 3C:
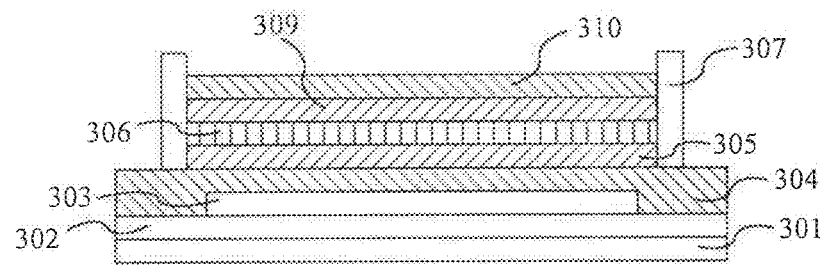

S3: as shown in FIG. 3B, a first peelable film 307 is prepared in an edge region of the first inorganic film layer 304, and a thickness of the first peelable film is about 20 μm.

S4: as shown in FIG. 3O, in a region defined by the first peelable film 307, a first organic film layer 305, an encapsulation reduction layer 306, a second organic film layer 309, and a second inorganic film layer 310 are sequentially prepared.

Figure 3D:
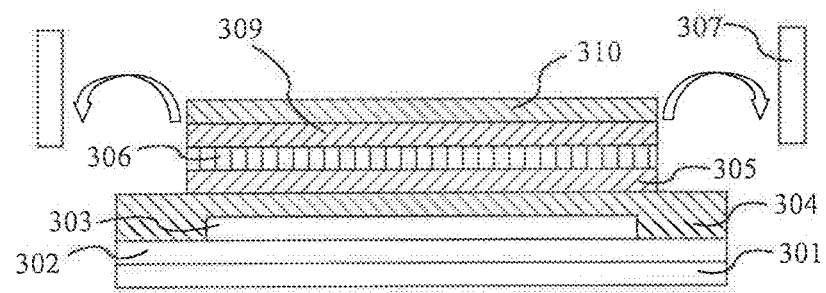

S5: as shown in FIG. 3D, the first peelable film 307 is peeled by using UV light irradiation or laser peeling technology.

Figure 3E:
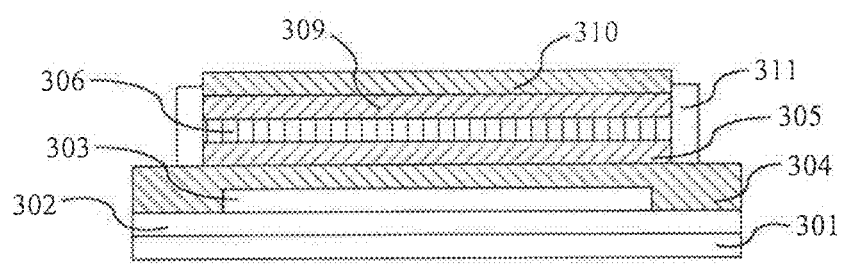

S8: as shown in FIG. 3E, a second peelable film 311 is prepared in a region of the first peelable film 307, and a top of the second peelable film 311 is lower than a plane on which a top of the second inorganic film layer 310 is located.

Figure 3F:
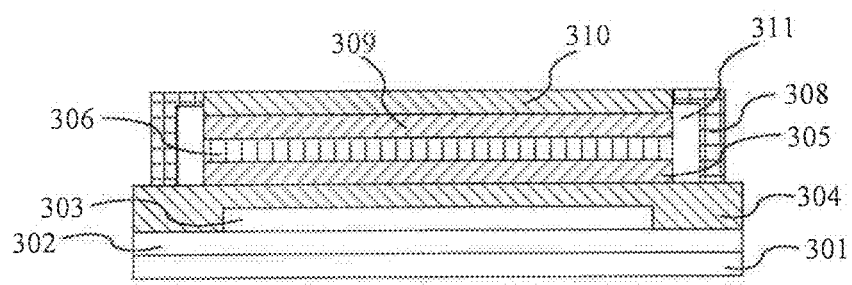

S9: as shown in FIG. 3F, a barrier film 308 is prepared outside the second peelable film 311, and a top of the barrier film 308 is flush with the top of the second inorganic film layer 310.

S10: determining whether to perform a dry reduction process to the encapsulation reduction layer through a color change of the encapsulation reduction layer is provided.

S101: if the encapsulation reduction layer has no color change, the encapsulation reduction layer is not subjected to the dry reduction process.

Figure 4A:
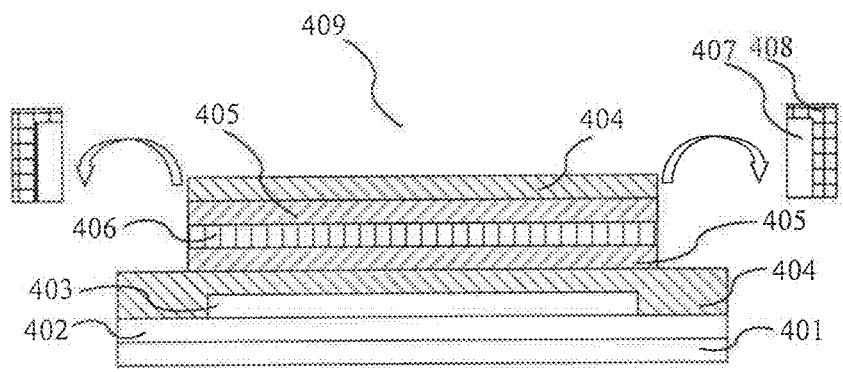
FIG. 4A to FIG. 4C are schematic diagrams of a reduction process of an encapsulation structure of a panel according to an embodiment of the present application.

S102: if the encapsulation reduction layer undergoes a color change, the encapsulation reduction layer is subjected to a dry reduction process. Referring to FIG. 4A to FIG. 40, which are schematic diagrams of a reduction process of an encapsulation structure of a panel according to an embodiment of the present application, comprising an encapsulation structure of a panel and a reduction device 410. The encapsulation structure of the panel includes a substrate 401, a protective layer 402, and a light emitting layer 403. The thin film encapsulation layer includes an encapsulation reduction layer 406, an encapsulation overlay layer formed by stacking an organic film layer 405 and an inorganic film layer 404 on each other, and a peelable water-oxygen barrier film. The water-oxygen barrier film includes a peelable film 407 and a barrier film 408. The reduction device 410 includes at least a molecular sieve water-absorption film 411 and a reducing gas 412. The dry reduction process of the encapsulated reduction layer includes the following steps:

S1021: first, peel the peelable film 407 and the barrier film 408 by using UV light irradiation or laser peeling technology to obtain a panel encapsulation structure 409 after peeling the peelable film 407 and the barrier film 408, as shown in FIG. 4A.

Figure 4B:
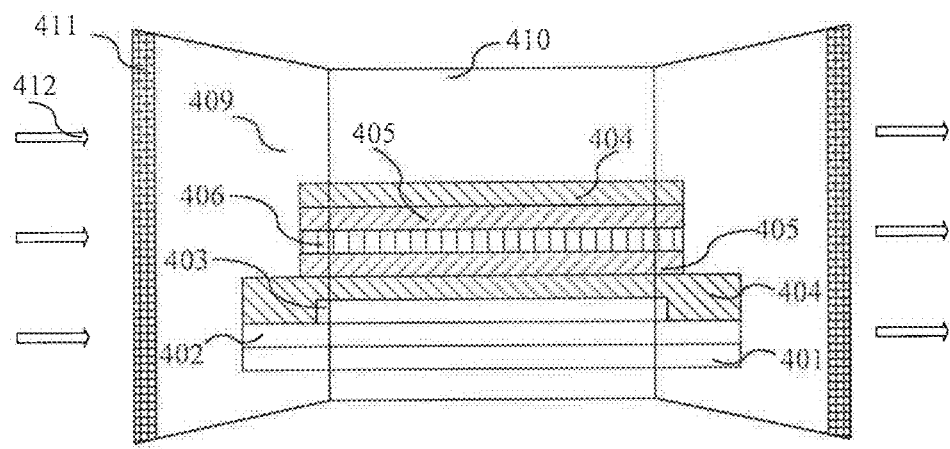

S1022: the panel encapsulation structure 409 is then placed in the reduction device 410. The reduction device 410 is provided with a reducing gas 412 flowing in a unidirectional direction at 80-100° C. Utilizing unidirectional fluidity of the reducing gas 412, flow of water and oxygen in the encapsulation reduction layer 406 in the panel encapsulation structure 409 is driven. The organic film layer 405 in the panel encapsulation structure 409 expands a path for water and oxygen flow in the encapsulation reduction layer 406. The circulating water and oxygen in the encapsulated reduction layer 406 will be adsorbed in the molecular sieve water-absorption film 411 in the reduction device 410. This realizes the reduction of the encapsulation reduction layer 406, and the reduction process is shown in FIG. 4B.

Figure 4C:
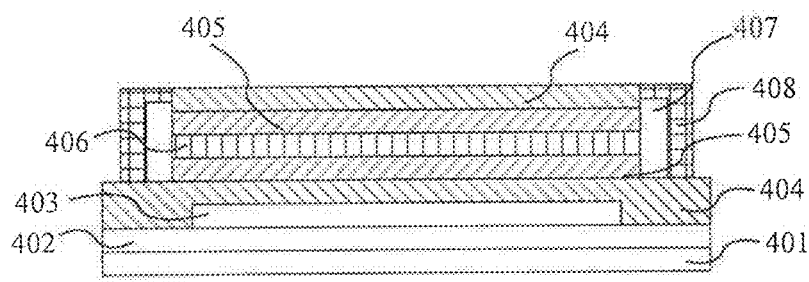

S1023: finally re-package the restored panel encapsulation structure to obtain the encapsulation structure shown in FIG. 4C. That is, a new peelable film 407 and a barrier film 408 are formed in a region of the original peelable film 407 and the barrier film 408. This completes the packaging of the panel encapsulation structure and achieves recyclability.

Figure 5:
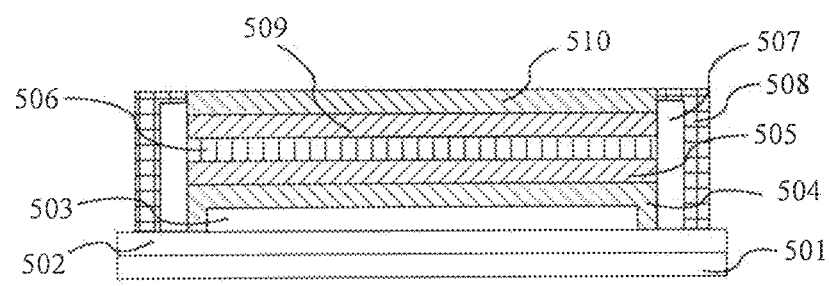
FIG. 5 is a schematic diagram of a second encapsulation structure of an OLED panel according to an embodiment of the present application.

Referring to FIG. 5, which is a schematic diagram of a second encapsulation structure of an OLED panel according to an embodiment of the present application, including a substrate 501, a protective layer 502, a light emitting layer 503, and an encapsulation layer prepared on the substrate 501. The encapsulation layer includes a first inorganic film layer 504, a first organic film layer 505, an encapsulation reduction layer 506, a second organic film layer 509, a second inorganic film layer 510, and a peelable water-oxygen barrier film. The water-oxygen barrier film includes a peelable film 507 and a barrier film 508.

The first inorganic film layer 504 covers an organic light emitting material region of the light emitting layer 503, and a region covered by the first inorganic film layer 504 is equal to a region defined by the water-oxygen barrier film.

Figure 6:
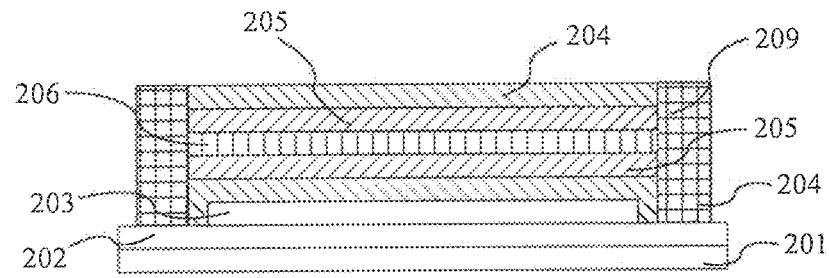
FIG. 6 is a schematic diagram of a third encapsulation structure of an OLED panel according to an embodiment of the present application.

Referring to FIG. 6, which is a schematic diagram of a third encapsulation structure of an OLED panel according to an embodiment of the present application. Reference numerals are the same as those in FIG. 2, and will not be repeated here. Compared with FIG. 2 and FIG. 5, the difference is that the water-oxygen barrier film adopts an integrated design of a peelable film and a barrier film, which reduces the manufacturing process.

As shown in FIG. 2, FIG. 5, and FIG. 6, respectively, three types of OLED panel encapsulation structure diagrams are shown. In the OLED panel encapsulation structure, the inorganic film layer, the organic film layer, and the encapsulation reduction layer are not limited to symmetrical settings. Different layer sequences can be selected according to different needs.

In summary, by changing an edge design of the panel encapsulation structure and adding an encapsulation reduction layer to the encapsulation structure, the encapsulation reduction layer can be restored by subsequent processing after being eroded by water and oxygen. This prevents the OLED display device from being oxidized, thereby extending a life of the device.

It can be understood that, for a person of ordinary skill in the art, equivalent replacements or changes may be made according to the technical solution and the inventive concept of the present application. All these changes or replacements should fall within the protection scope of the claims attached to the present application.

What is claimed is:

1. A method of manufacturing an encapsulation structure of an OLED display panel, comprising following steps:
   S1: providing an OLED display panel to be packaged;
   S2: forming a first inorganic film layer, wherein the first inorganic film layer covers an organic light emitting material region of the OLED display panel;

S3: forming a first peelable film on an upper side or an outer side of an end portion of the first inorganic film layer;

S4: sequentially forming a first organic film layer, an encapsulation reduction layer, a second organic film layer, and a second inorganic film layer in a region defined by the first peelable film; wherein a top of the second inorganic film layer is lower than a top of the first peelable film;

S5: peeling the first peelable film, and forming a second peelable film in a first peelable film region, wherein a top of the second peelable film is lower than the top of the second inorganic film layer;

S6: forming a barrier film outside the peelable film, wherein a top of the barrier film is flush with the top of the second inorganic film layer; and S7: determining whether to perform a dry reduction process to the encapsulation reduction layer through a color change of the encapsulation reduction layer.

2. The method of manufacturing the encapsulation structure of the OLED display panel according to claim 1, wherein steps S5 and S6 are combined into following steps:

S5: peeling the first peelable film, and forming a peelable water-oxygen barrier film in the first peelable film region, wherein a top of the peelable water-oxygen barrier film is flush with the top of the second inorganic film layer.

3. The method of manufacturing the encapsulation structure of the OLED display panel according to claim 1, wherein S7 further comprises following steps:

S71: if the encapsulation reduction layer has no color change, the encapsulation reduction layer is not subjected to the dry reduction process;

S72: if the encapsulation reduction layer undergoes a color change, the encapsulation reduction layer is subjected to a dry reduction process, comprising following steps:

S721: peeling the second peelable film and the barrier film;

S722: passing a one-way flowing reducing gas into the reduction device, and performing the dry reduction process to the encapsulation reduction layer by using a common action of the reducing gas, the molecular sieve water-absorbing film, the first organic film layer, and the second organic film layer; and S723: reforming the second peelable film and the barrier film, wherein the second peelable film and the barrier film are disposed at positions where the second peelable film and the barrier film are originally disposed.

4. The method of manufacturing the encapsulation structure of the OLED display panel according to claim 1, wherein S7 further comprises following steps:

S71: if the encapsulation reduction layer has no color change, the encapsulation reduction layer is not subjected to the dry reduction process;

S72: if the encapsulation reduction layer undergoes a color change, the encapsulation reduction layer is subjected to the dry reduction process, comprising following steps:

S721: peeling the second peelable film and the barrier film;

S722: passing a one-way flowing reducing gas into the reduction device, and performing the dry reduction process to the encapsulation reduction layer by using a common action of the reducing gas, the molecular sieve water-absorbing film, the first organic film layer, and the second organic film layer; and S723: forming the peelable water-oxygen barrier film, where t the peelable water-oxygen barrier film is located at positions where the second peelable film and the barrier film are originally disposed.

5. The method of manufacturing the encapsulation structure of the OLED display panel according to claim 1, wherein the first peelable film is peeled using UV light irradiation or laser peeling technology.

* * * * *